(12) United States Patent
Kasorla et al.

(10) Patent No.: US 8,743,603 B2
(45) Date of Patent: Jun. 3, 2014

(54) EFFICIENT DATA STORAGE IN MULTI-PLANE MEMORY DEVICES

(71) Applicant: Apple Inc., Cupertino, CA (US)

(72) Inventors: Yoav Kasorla, Kfar Netar (IL); Eyal Gurgi, Petah-Tikva (IL); Dotan Sokolov, Ra'anana (IL); Ofir Shalvi, Ra'anana (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/890,704

(22) Filed: May 9, 2013

(65) Prior Publication Data

US 2013/0254470 A1    Sep. 26, 2013

Related U.S. Application Data

(62) Division of application No. 12/332,370, filed on Dec. 11, 2008, now Pat. No. 8,456,905.

(60) Provisional application No. 61/014,048, filed on Dec. 16, 2007, provisional application No. 61/016,570, filed on Dec. 25, 2007.

(51) Int. Cl.
*G11C 11/34*    (2006.01)

(52) U.S. Cl.
USPC ............. 365/185.02; 365/185.12; 365/185.17

(58) Field of Classification Search
CPC ........... G11C 16/26; G11C 7/103; G11C 7/00
USPC .......................... 365/185.02, 185.12, 185.17
See application file for complete search history.

(56) References Cited

U.S. PATENT DOCUMENTS 7,420,847 B2 *    9/2008    Li ............................. 365/185.22

* cited by examiner

*Primary Examiner* — Son Dinh
*Assistant Examiner* — Nam Nguyen
(74) *Attorney, Agent, or Firm* — Meyertons, Hood, Kivlin, Kowert & Goetzel, P.C.

(57) ABSTRACT

A method for data storage includes initially storing a sequence of data pages in a memory that includes multiple memory arrays, such that successive data pages in the sequence are stored in alternation in a first number of the memory arrays. The initially-stored data pages are rearranged in the memory so as to store the successive data pages in the sequence in a second number of the memory arrays, which is less than the first number. The rearranged data pages are read from the second number of the memory arrays.

20 Claims, 5 Drawing Sheets

EFFICIENT DATA STORAGE IN MULTI-PLANE MEMORY DEVICES

CROSS-REFERENCE TO RELATED APPLICATIONS

This application is a divisional application of U.S. patent application Ser. No. 12/332,370, entitled "EFFICIENT DATA STORAGE IN MULTI-PLANE MEMORY DEVICES," filed Dec. 11, 2008, which claims the benefit of U.S. Provisional Patent Application 61/014,048, filed Dec. 16, 2007, and U.S. Provisional Patent Application 61/016,570, filed Dec. 25, 2007, whose disclosures are incorporated herein by reference.

FIELD OF THE INVENTION

The present invention relates generally to memory devices, and particularly to methods and systems for data storage in memory devices having multiple memory planes.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24th International Conference on Microelectronics (MIEL), Nis, Serbia and Montenegro, May 16-19, 2004, volume 1, pages 377-384, which is incorporated herein by reference.

Some memory device configurations comprise multiple memory arrays, often referred to as memory planes. Various methods and systems for storing data in multi-plane memory devices are known in the art. For example, U.S. Pat. No. 7,280,398, whose disclosure is incorporated herein by reference, describes a system and method for performing memory operations in a multi-plane Flash memory. Commands and addresses are sequentially provided to the memory for memory operations in memory planes. The memory operations are initiated sequentially, and the memory operation for at least one of the memory planes is initiated during the memory operation for another memory plane.

U.S. Pat. No. 7,257,027, whose disclosure is incorporated herein by reference, describes a NAND-type Flash memory device having a multi-plane structure. Page buffers are divided into even page buffers and odd page buffers and are driven at the same time. Cells connected to even bit lines within one page and cell connected to odd bit lines within one page are programmed, read and copyback-programmed at the same time.

U.S. Application Publication 2006/0218359, whose disclosure is incorporated herein by reference, describes a computational system comprising a controller and a multi-plane solid state memory device accessible to the controller. The controller is configured to provide access to a virtual block having a virtual block address that represents a first block from a first plane of the multi-plane solid state memory device and represents a second block from a second plane of the multi-plane solid state memory device.

SUMMARY OF THE INVENTION

An embodiment of the present invention provides a method for data storage, including:

initially storing a sequence of data pages in a memory that includes multiple memory arrays, such that successive data pages in the sequence are stored in alternation in a first number of the memory arrays;

rearranging the initially-stored data pages in the memory so as to store the successive data pages in the sequence in a second number of the memory arrays, which is less than the first number; and reading the rearranged data pages from the second number of the memory arrays.

In some embodiments, reading the rearranged data pages includes reading a given data page and one or more neighboring data pages from the second number of the memory arrays and canceling cross-coupling interference in the given data page responsively to the read neighboring data pages. In a disclosed embodiment, reading the rearranged data pages includes caching the read data pages in a cache memory such that both the given data page and the neighboring data pages are cached in the cache memory at a given time, and canceling the cross-coupling interference includes canceling the interference using the cached given data page and neighboring data pages.

In another embodiment, the second number of the memory arrays includes a single memory array. In yet another embodiment, the second number of the memory arrays includes two or more memory arrays, and rearranging the initially-stored data pages includes storing the successive data pages in alternation in the second number of the memory arrays.

In still another embodiment, rearranging the initially-stored data pages includes rearranging the initially-stored data pages so as to store the successive data pages in a third number of the memory arrays, which is smaller than the first number and larger than the second number, and rearranging the data pages stored in the third number of the memory arrays so as to store the successive data pages in the second number of the memory arrays.

In an embodiment, rearranging the initially-stored data pages includes defining multiple groups of the memory arrays, each group having the second number of the memory arrays, and storing respective subsets of the successive data pages in the groups. Storing the subsets in the groups may include sending multi-plane write commands, each command specifying storage of the second number of the data pages in each of the groups. In a disclosed embodiment, initially storing the sequence includes sending multi-plane write commands, each command specifying storage of the first number of the data pages in the first number of the memory arrays.

Initially storing the sequence may include sending an acknowledgement indication responsively to a successful completion of initially-storing the sequence, irrespective of rearrangement of the initially-stored data pages. In some embodiments, the initially-stored data pages are rearranged during an idle period in which no memory access operations are performed.

In some embodiments, each of the memory arrays includes a plurality of analog memory cells, initially storing the sequence includes programming the memory cells in the first number of the memory arrays using first programming parameters, and rearranging the data pages includes programming the memory cells in the second number of the memory arrays using second programming parameters, different from the first programming parameters. In a disclosed embodiment, programming the memory cells using the first programming parameters includes programming the memory cells to assume a first number of programming levels, and programming the memory cells using the second programming parameters includes programming the memory cells to assume a second number of programming levels, larger than the first number.

Additionally or alternatively, programming the memory cells using the first programming parameters includes applying to the memory cells a first sequence of programming pulses whose amplitude increases incrementally by a first step size, and programming the memory cells using the second programming parameters includes applying to the memory cells a second sequence of programming pulses whose amplitude increases incrementally by a second step size, smaller than the first step size.

In another embodiment, reading the rearranged data pages includes:

receiving a request from a host to retrieve one or more requested data pages in the sequence;

responsively to the request, reading from the second number of the memory arrays one or more non-requested data pages in the sequence, which were not requested by the host, as well as the requested data pages;

caching the read requested and non-requested data pages; and canceling cross-coupling interference in at least one of the requested data pages using the cached requested and non-requested data pages.

In yet another embodiment, initially storing the data pages includes storing the data pages in a Dynamic Random Access Memory (DRAM), and rearranging the initially-stored data pages includes copying the data pages from the DRAM to a non-volatile memory.

In still another embodiment, the memory cells in the second number of the memory arrays are arranged along multiple word lines, and rearranging the initially-stored data pages includes storing the data pages in an ascending order of the word lines and in a reverse order of the sequence.

There is additionally provided, in accordance with an embodiment of the present invention, a method for data storage, including:

storing a sequence of data pages in a memory;

receiving a series of requests from a host to sequentially retrieve the stored data pages from the memory;

responsively to a given request received at a given time, reading from the memory one or more non-requested data pages in the sequence, which were not yet requested by the host at the given time, as well as reading one or more requested data pages specified in the given request;

caching the read requested and non-requested data pages; and canceling cross-coupling interference in at least one of the requested data pages using the cached requested and non-requested data pages.

There is also provided, in accordance with an embodiment of the present invention, a data storage apparatus, including:

a memory, which includes multiple memory arrays; and circuitry, which is coupled to initially store a sequence of data pages in the memory such that successive data pages in the sequence are stored in alternation in a first number of the memory arrays, to rearrange the initially-stored data pages in the memory so as to store the successive data pages in the sequence in a second number of the memory arrays, which is less than the first number, and to read the rearranged data pages from the second number of the memory arrays.

There is further provided, in accordance with an embodiment of the present invention, a data storage apparatus, including:

a memory; and a processor, which is coupled to store a sequence of data pages in a memory, to receive a series of requests from a host to sequentially retrieve the stored data pages from the memory, to read from the memory, responsively to a given request received at a given time, one or more non-requested data pages in the sequence that were not yet requested by the host at the given time, as well as reading one or more requested data pages specified in the given request, to cache the read requested and non-requested data pages, and to cancel cross-coupling interference in at least one of the requested data pages using the cached requested and non-requested data pages.

There is additionally provided, in accordance with an embodiment of the present invention, a data storage apparatus, including:

an interface, which is operative to communicate with a memory that includes multiple memory arrays; and a processor, which is coupled to initially store a sequence of data pages in the memory such that successive data pages in the sequence are stored in alternation in a first number of the memory arrays, to cause the memory to rearrange the initially-stored data pages in the memory so as to store the successive data pages in the sequence in a second number of the memory arrays, which is less than the first number, and to read the rearranged data pages from the second number of the memory arrays.

The present invention will be more fully understood from the following detailed description of the embodiments thereof, taken together with the drawings in which:

DETAILED DESCRIPTION OF EMBODIMENTS

Overview

Figure 1:
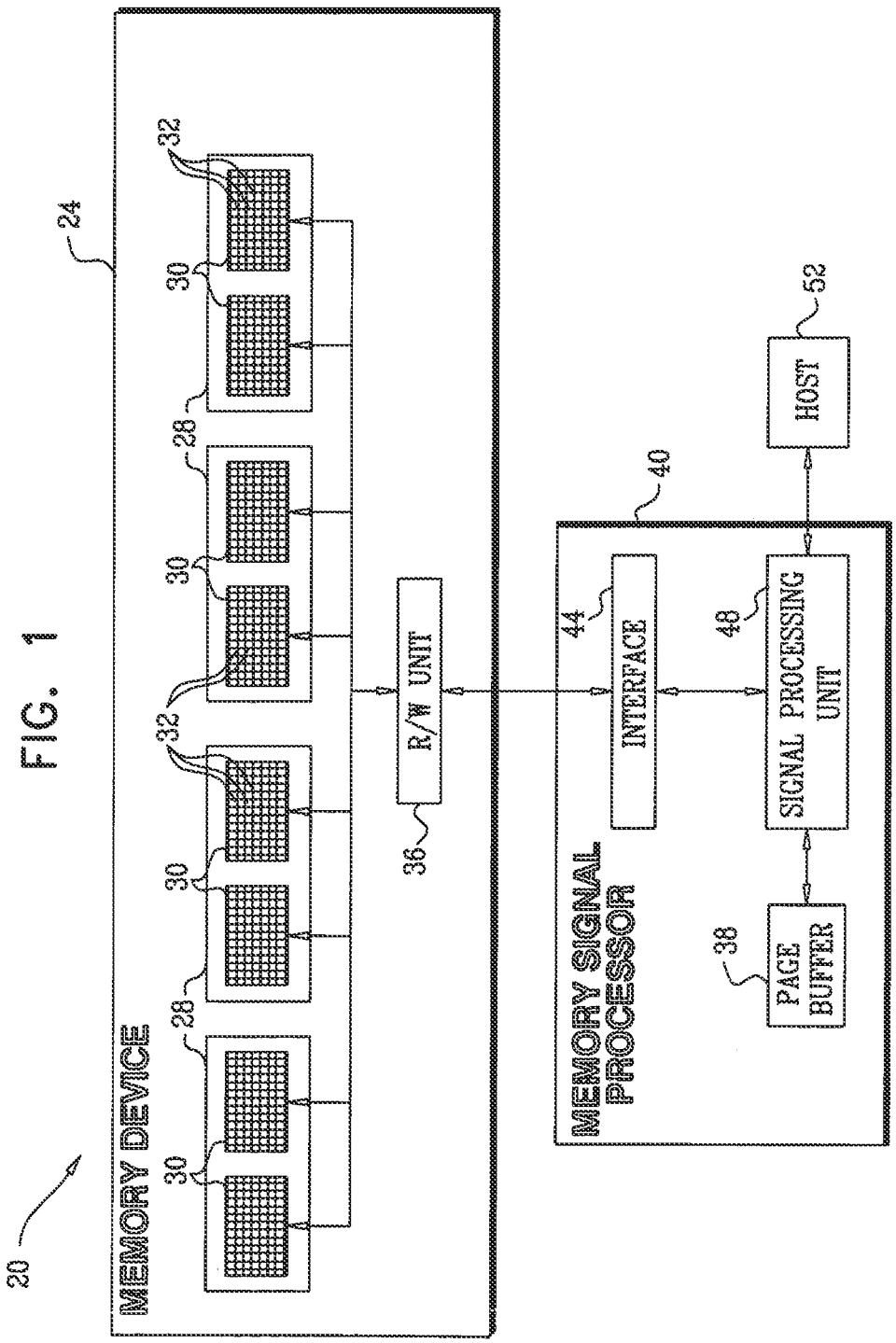
FIG. 1 is a block diagram that schematically illustrates a memory system, in accordance with an embodiment of the present invention.

Some memory devices comprise multiple separate memory arrays that are operated in parallel in order to increase the speed of memory access operations. The separate arrays are commonly referred to as memory planes, and such memory devices are referred to as multi-plane devices. Multi-plane memory devices usually support multi-plane read and write commands, which perform reading and writing of multiple pages to multiple memory planes in parallel.

On the other hand, in some applications that involve caching of read pages, there is a distinct disadvantage in storing the data in multiple memory planes. The disadvantage stems from the fact that retrieved memory pages are usually cached in the order in which they are read from the memory device. When the read data is stored in multiple planes, pages that originate from different planes are cached in an alternating order. Since the memory device is usually capable of caching only a limited number of pages, the number of cached pages belonging to a given memory plane is small.

Having access to only a small number of pages from the same plane can be problematic for some applications. For example, a given memory page may suffer from cross-coupling interference from neighboring pages in the same memory plane. The cross-coupling interference can be canceled using the data read from the interfered page together with the data read from its neighbor pages. For this purpose, a page buffer used for interference cancellation should be dimensioned so that both the interfered memory page and its neighbors are present in the buffer simultaneously. When the number of planes is high, and/or when a given page is subject to interference from a large number of pages, the required buffer size may become prohibitive.

Embodiments of the present invention that are described hereinbelow provide improved methods and systems for data storage in multi-plane memory devices. The disclosed methods and systems initially store a sequence of data pages in a multi-plane manner, such that successive pages in the sequence are stored in a certain number of memory planes in alternation. At a later time, the data is rearranged in the memory so as to store successive data pages in a smaller number of memory planes. In some embodiments, the data is rearranged so as to store it sequentially in a single memory plane.

When the data is to be retrieved, the data is read from the smaller number of memory planes into which it was rearranged. Reading the data from a small number of memory planes (e.g., from a single plane) simplifies the task of canceling cross-coupling interference, and enables the use of a smaller page buffer. Since interference cancellation is performed using the cached data and does not require additional dedicated read operations, the overall reading speed is increased, as well.

Thus, the methods and systems described herein enable fast and efficient data programming using the powerful features of multi-plane storage. By rearranging the stored data into a smaller number of memory planes, the disclosed methods and systems provide high-performance reading and cross-coupling interference cancellation using limited-size buffer memories.

Several examples of multi-plane to single-plane and multi-plane to multi-plane rearrangement processes are described herein. In some embodiments, the data is rearranged by applying a series of progressive rearrangement operations, each operation reducing the number of planes over which successive pages are cached. Some disclosed embodiments employ a read-ahead mechanism, in which data pages that were not yet requested (e.g., by a host) are read, buffered and used for canceling cross-coupling interference in requested pages.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in multiple analog memory cells 32, which are arranged in two or more separate cell arrays 30. Cell arrays 30 are also referred to as memory planes, and device 24 is thus referred to as a multi-plane device. In some embodiments, the memory device may comprise multiple separate semiconductor dies 28, each comprising one or more of the memory planes. For example, device 24 may comprise a Multi-Chip Package (MCP) in which the multiple dies are assembled. In the example embodiment of FIG. 1, memory device 24 comprises four dies 28, each comprising two memory planes 30, to form a total of eight planes in the device. In alternative embodiments, however any other suitable numbers of memory planes, dies and planes per die can also be used.

In the context of the present patent application and in the claims, the term "analog memory cell" is used to describe any memory cell that holds a continuous, analog value of a physical parameter, such as an electrical voltage or charge. Arrays 30 may comprise analog memory cells of any kind, such as, for example, NAND, NOR and CTF Flash cells, PCM, NROM, FRAM, MRAM and DRAM cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells of each memory plane to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell.

Memory device 24 comprises a reading/writing (R/W) unit 36, which converts data for storage in the memory device to storage values and writes them into memory cells 32 of the different memory planes. In alternative embodiments, the R/W unit does not perform the conversion, but is provided with voltage samples, i.e., with the storage values for storage in the cells. The R/W unit typically (although not necessarily) programs the cells using an iterative Program and Verify (P&V) process, as is known in the art. When reading data out of memory cells 32, R/W unit 36 converts the storage values of cells 32 into digital samples having a resolution of one or more bits. Data is typically written to and read from the memory cells of a given plane in groups that are referred to as pages.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device.

MSP 40 comprises a page buffer 38, for temporarily caching multiple data pages that are processed by the MSP. For example, when canceling cross-coupling interference in a given page, the MSP typically uses the read results of neighboring pages that are cached in the page buffer. Buffer 38 typically comprises Random Access Memory (RAM) cells. In a typical application, the size of buffer 38 is on the order of ten pages, although any other suitable size can also be used. The use of page buffer 38 in performing data storage and retrieval is addressed in greater detail below.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which elements of the memory device (e.g., the R/W unit, the page cache and/or one or more of the memory planes) are disposed. Further alternatively, some or all of the functionality of MSP 40 can be implemented in software and carried out by a processor or other element of the host system, or by a suitable memory controller. In some implementations, a single MSP 40 may be connected to multiple memory devices 24. In yet another embodiment, some or all of the MSP functionality may be carried out by a separate unit, referred to as a memory extension, which acts as a slave of memory device 24.

Typically, the MSP (or any other controller or processor that carries out some or all of the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Within a given memory plane, memory cells 32 are typically arranged in a grid having multiple rows and columns, commonly referred to as word lines and bit lines, respectively. The memory plane is typically divided into multiple pages, i.e., groups of memory cells that are programmed and read simultaneously. Cells are typically erased in groups of word lines that are referred to as erasure blocks.

In some embodiments, R/W unit 36 programs memory cells 32 using an iterative Program and Verify (P&V) process. In a typical P&V process, an entire memory page is written by applying a sequence of programming pulses to a group of memory cells that are mapped to this page. The level of the programming pulses increases incrementally from pulse to pulse. The storage values programmed in the cells are read ("verified") after each pulse, and the iterations continue until the desired levels are reached.

In FIG. 1, R/W unit 36 is shown as a single unit that performs reading and writing in the different memory planes. This configuration is shown purely for the sake of clarity. In a typical implementation, each memory plane (or each die) comprise some on-chip R/W circuitry for performing reading and writing in the memory cells of the respective plane or die. Additionally or alternatively, some R/W functions may be performed by circuitry that is common to different planes, e.g., to the entire device. Thus, the functions of R/W unit 36 may be partitioned in any suitable manner among on-chip circuitry disposed on the different dies and circuitry that is common to multiple different dies.

Multi-Plane Vs Single-Plane Storage and Retrieval

In some embodiments, multi-plane device 24 supports multi-plane write commands, which write data into multiple pages belonging to multiple different planes in parallel. In the embodiment of FIG. 1, device 24 supports multi-plane commands that write eight data pages into the eight respective memory planes of the device concurrently. Multi-plane write commands increase the writing speed of the device, since they enable the device to perform multiple memory access operations in parallel, or at least in semi-parallel. Device 24 may also support multi-plane read commands that read data from multiple pages belonging to different planes in parallel.

In some practical cases, however, there is a distinct disadvantage in holding data in device 24 (and particularly in reading data from the device) in a multi-plane manner. The disadvantage stems from the fact that the MSP typically caches retrieved pages in page buffer 38 in the order in which they are read from the device. When the data is stored and read in a multi-plane manner, buffer 38 holds pages that alternate among the different planes. In some applications (e.g., when performing cross-coupling interference cancellation), it is desirable to cache a certain minimum number of successive pages from the same memory plane at a given time. When the data is stored and read in a multi-plane manner, the size of page buffer 38 has to be increased in order to meet the above-mentioned requirement. On the other hand, when the data is stored and read in a single-plane manner, a modest-size buffer is usually sufficient for caching the desired number of pages from a given plane.

The description that follows demonstrates the advantage of storing and reading data in a single-plane manner in canceling cross-coupling interference. The storage values stored in cells 32 are sometimes distorted by cross-coupling interference from other memory cells. The interference in a certain interfered page is typically caused by neighboring pages in the same memory plane as the interfered page. In some embodiments, MSP 40 cancels the cross-coupling interference in a given interfered page using the storage values of the cells in the interfering neighboring pages. The data read from the interfered page, as well as the data read from the neighboring pages, is cached in page buffer 38.

When data is stored and retrieved from the device in a multi-plane manner, buffer 38 will hold alternating pages that originate from the different planes. Most of these cached pages are irrelevant for canceling the interference in the interfered page, since they originate from other planes and are certainly not neighbors of this page. In order to perform interference cancellation in a given interfered page, the size of buffer 38 is typically defined so that both the interfered page and its neighbors are likely to be cached in the page buffer at the same time. Otherwise, one or more of the interfering pages may need to be read separately for the sake of interference cancellation, a task that complicates the reading operation and reduces reading speed.

When the pages are cached in alternating order among the different planes (because the data was read in a multi-plane manner), the desired size of buffer 38 increases considerably. The effect of multi-plane storage on the size of buffer 38 is especially severe when the interference in a given page is caused by a large number of neighboring pages, for example when cells 32 comprise multi-level cells such that each cell stores data pertaining to multiple pages.

In summary, multi-plane storage is typically advantageous in improving programming speed. Single-plane storage, on the other hand, is typically advantageous in improving reading time when performing interference cancellation using a limited-size page buffer.

Data Rearrangement from Multi-Plane to Single-Plane Format

Embodiments of the present invention that are described herein provide improved methods and systems for data storage in multi-plane memory devices. The disclosed methods and systems initially store data in the memory device in a multi-plane manner, such that the data is stored in alternation in a certain number of memory planes. At a later time, the data is rearranged, so as to store the data in alternation in a smaller number of memory planes. In some embodiments, the data is rearranged so as to store it sequentially in a single memory plane.

When the data is to be retrieved, the data is read from the smaller number of memory planes into which it was rearranged. Reading the data from a small number of memory planes (e.g., a single plane) simplifies the task of canceling cross-coupling interference, and enables the use of a smaller page buffer. The efficient use of the page buffer enables using a given-size buffer for additional purposes. For example, the MSP can read soft information from the data pages, e.g., by reading the cells using multiple read thresholds, and cache the read results at a higher resolution.

In the embodiments described herein, the various functions described herein (e.g., initial storage, data rearrangement, subsequent data retrieval and interference cancellation) are carried out by MSP 40 (or other controller that controls device 24). Alternatively, however, these functions can be carried out by elements internal to device 24 (e.g., by unit 36) or by elements external to the device (e.g., MSP 40). In some implementations, page buffer 38 may be located internally to the memory device. In the context of the present patent application and in the claims, these elements are referred to collectively as data storage circuitry, which is coupled to the memory and carries out the methods described herein. The disclosed methods can be partitioned among the different elements in any suitable way.

Multi-Plane to Single-Plane Rearrangement Example

Figure 2:
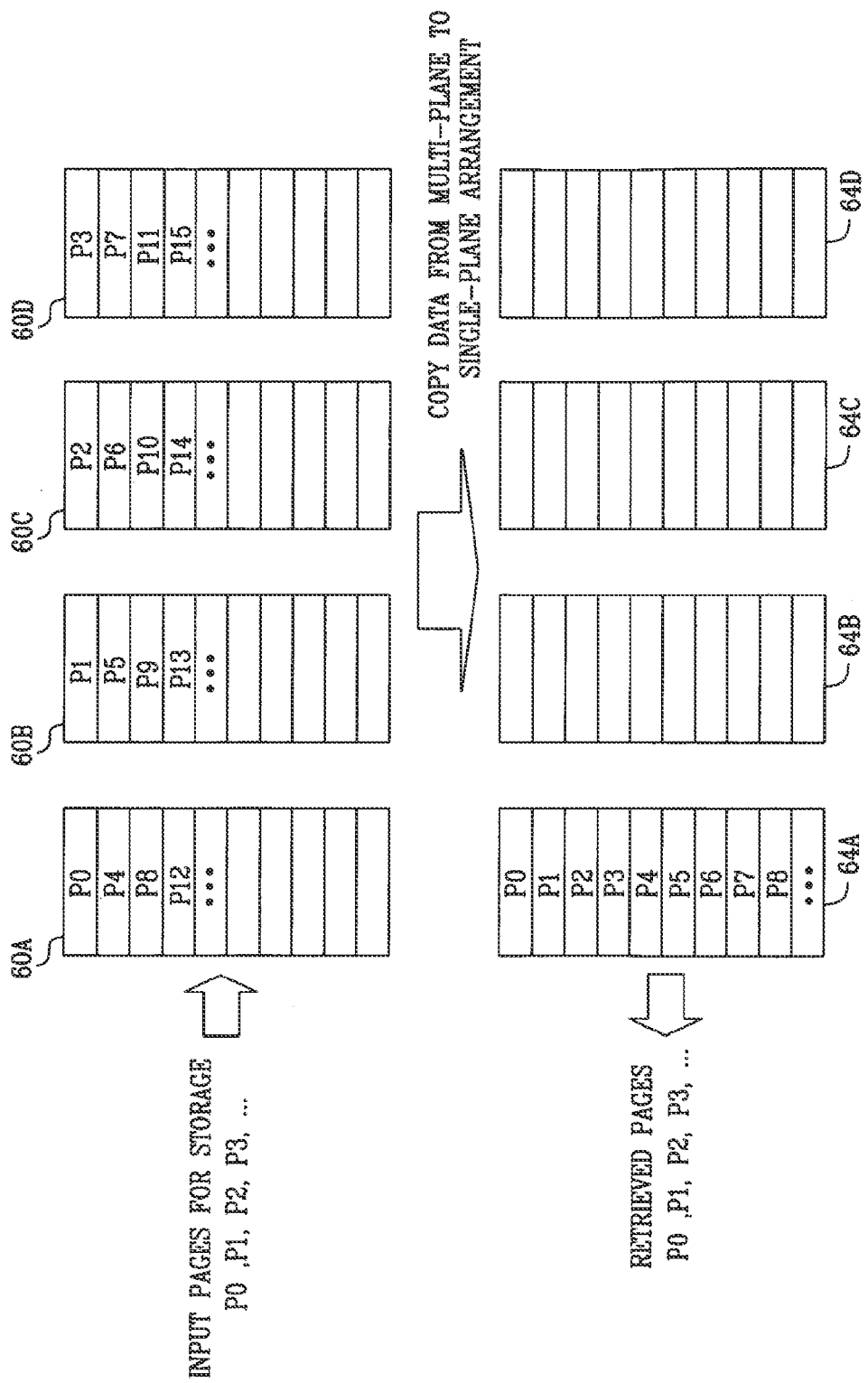
FIG. 2 is a diagram that schematically illustrates a process for rearranging data from a multi-plane format to a single-plane format, in accordance with an embodiment of the present invention.

FIG. 2 is a diagram that schematically illustrates a process for rearranging data from a multi-plane format to a single-plane format, in accordance with an embodiment of the present invention. In the example of FIG. 2, MSP 40 stores a sequence of data pages denoted P0, P1, P2, P3, . . . in memory device 24. For example, the sequence may comprise data of a large file that is to be stored sequentially in the memory device.

The MSP initially stores the data pages in four memory planes 60A . . . 60D, such that successive data pages in the sequence are stored in the different memory planes in alternation. In some embodiments, the MSP stores the data by sending multi-plane write commands to the memory device. In the present example, the first multi-plane write command stores pages P0 . . . P3 in planes 60A . . . 60D, respectively. The next multi-plane write command stores pages P4 . . . P7 in planes 60A . . . 60D, respectively, and so on.

At a later time, the MSP rearranges the initially-stored data pages into a single plane 64A. As can be seen in the figure, after rearrangement the data pages in the sequence are stored sequentially in a single memory plane. The MSP may rearrange the data at any suitable time after initial storage of the data, such as immediately following the initial multi-plane storage, or during an idle period in which the MSP and memory device are not busy performing other storage tasks.

When the MSP receives a request to retrieve the data, it reads the rearranged data pages from memory plane 64A, typically using single-plane read commands. The read pages are cached in page buffer 38 in the order in which they are read. In particular, neighboring pages in memory plane 64A will be cached adjacently to one another in the page buffer. MSP 40 may perform interference cancellation on a given interfered page by reading both the interfered page and its neighbors from buffer 38.

Thus, the disclosed method provides fast initial data storage using multi-plane write commands, without compromising the ability to perform interference cancellation using a limited-size buffer memory.

In the description above, data rearrangement is initiated and performed by the MSP. Alternatively, data rearrangement can be performed by circuitry that is internal to the memory device, e.g., by the R/W unit. Data rearrangement can be carried out using any suitable combination of single- or multi-plane read and write commands, and/or using internal single- or multi-plane copy-back commands in the memory device.

When using copy-back commands, errors in re-reading the initially-stored data may introduce errors into the rearranged data. (When the data is rearranged using separate read and write commands, the read data typically undergoes Error Correction Code (ECC) decoding, which reduces the likelihood of errors. Rearrangement using copy-back commands usually does not include ECC decoding.) The MSP may reduce the likelihood of such errors using several means. For example, the MSP may perform the copy-back operation shortly after the data was initially stored, so that voltage drifts and other impairments that increase over time will not be dominant. The MSP may allow a certain number of errors, which will eventually be corrected when the rearranged data is read. Additionally or alternatively, the MSP may retrieve the data read by the copy-back operation, perform ECC decoding, and send the corrected bits back to the memory device.

In some embodiments, the data is rearranged by copying the data to different memory locations, e.g., to another memory block. Alternatively, data rearrangement can be performed in-place, so that the rearranged data occupies the same (or at least partially overlapping) memory locations as the initially-stored data.

Data Storage Method Description

Figure 3:
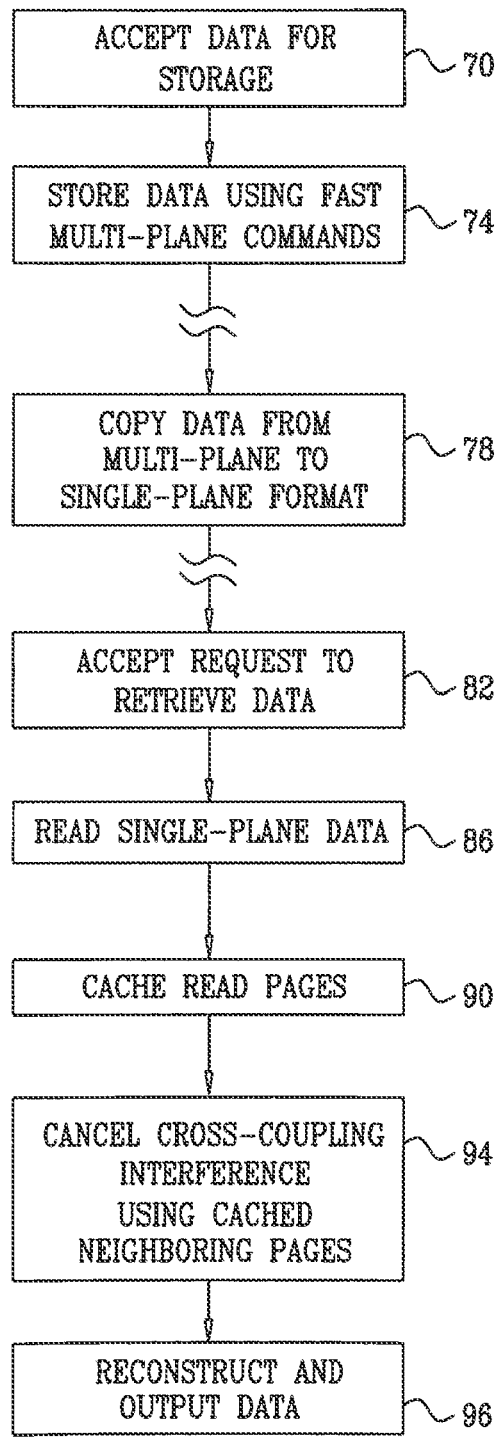
FIG. 3 is a flow chart that schematically illustrates a method for data storage and retrieval, in accordance with an embodiment of the present invention.

FIG. 3 is a flow chart that schematically illustrates a method for data storage and retrieval, in accordance with an embodiment of the present invention. The method begins with MSP 40 accepting from host 52 data for storage, at an input step 70. The MSP formats the data in a sequence of data pages, and stores the data pages in multiple memory planes in alternation, at an initial storage step 74. Typically, the MSP stores the data by issuing fast multi-plane write commands to the memory device.

In some embodiments, once the initial storage is completed successfully, the MSP sends to the host an acknowledgement indicating that the data has been stored. Thus, the host application enjoys the fast storage time enabled by the multi-plane storage, irrespective of the subsequent rearrangement operations performed on the data.

At a later time after initial storage of the data, the MSP rearranges the data pages into a single-plane format, at a single-plane rearrangement step 78. The MSP copies the initially-stored data pages into a single memory plane, such that successive pages are stored sequentially in this plane. Typically, the MSP erases the initially-stored data after successfully completing the rearrangement.

At a certain time after the data has been rearranged, the MSP receives a request from host 52 to retrieve the data, at a request acceptance step 82. In response to the request, the MSP reads the data pages from the single memory plane into which they have been copied, at a single-plane reading step 86.

MSP 40 caches the read data pages in memory buffer 38, at a caching step 90. Buffer 38 has a finite size of N pages. Thus, cache 38 is able to hold the N most-recently read pages.

When a given page is distorted by cross-coupling interference, MSP 40 applies interference cancellation to this page using the data read from neighboring pages, which are cached in buffer 38, at an interference cancellation step 94. Various interference cancellation schemes are known in the art, and any suitable scheme can be used by MSP 40. Several example techniques for canceling cross-coupling interference are described in PCT International Publications WO 2007/132453, WO 2007/132457, WO 2008/053472 and WO 2008/111058, whose disclosures are incorporated herein by reference. In some embodiments, the data stored in each page is encoded with an ECC, and the MSP applies interference cancellation in a given page in response to a failure to decode the ECC.

Since in the single-plane format successive data pages in the sequence are stored sequentially in the memory plane, both the interfered page and its neighbors will be cached in buffer 38 at the same time. Thus, the MSP is able to apply interference cancellation using the cached data, without a need for additional read operations. Following interference cancellation, the MSP reconstructs and outputs the requested data to the host, at an output step 96.

Multi-Plane to Multi-Plane Data Rearrangement

The multi-plane to single-plane rearrangement process described in FIGS. 2 and 3 above involves a number of read and write operations, which take a certain time to complete. Typically, most of this time is taken by single-plane write operations. As such, it is possible that the host will request retrieval of the data before the rearrangement process is completed. In some embodiments, such a scenario (as well as any other scenario in which the data rearrangement process failed to complete) can be resolved by retrieving the initially-stored pages, in the multi-plane format. In these embodiments, data retrieval may be slower, especially when interference cancellation is performed. Still, the stored data is not lost and can be provided to the host.

Alternatively, the likelihood of encountering such a scenario can be reduced by reducing the data rearrangement time. In some embodiments, instead of rearranging the initially-stored data into a single-plane format, the MSP rearranges the data into another multi-plane format having a smaller number of pages. For example, the MSP can initially store the data pages in eight memory planes, and later rearrange the data by storing it in four memory planes. Rearranging data from eight planes to four planes takes a considerably shorter time than rearranging the data from eight planes to a single plane. Therefore, the host is less likely to request the data before rearrangement is complete. On the other hand, the achievable reading speed, assuming interference cancellation that uses a limited-size page buffer, is reduced.

Thus, conversion to a multi-plane format having a smaller number of planes provides a trade-off between conversion speed and reading performance. Such a trade-off may be preferable in some practical cases.

Figure 4:
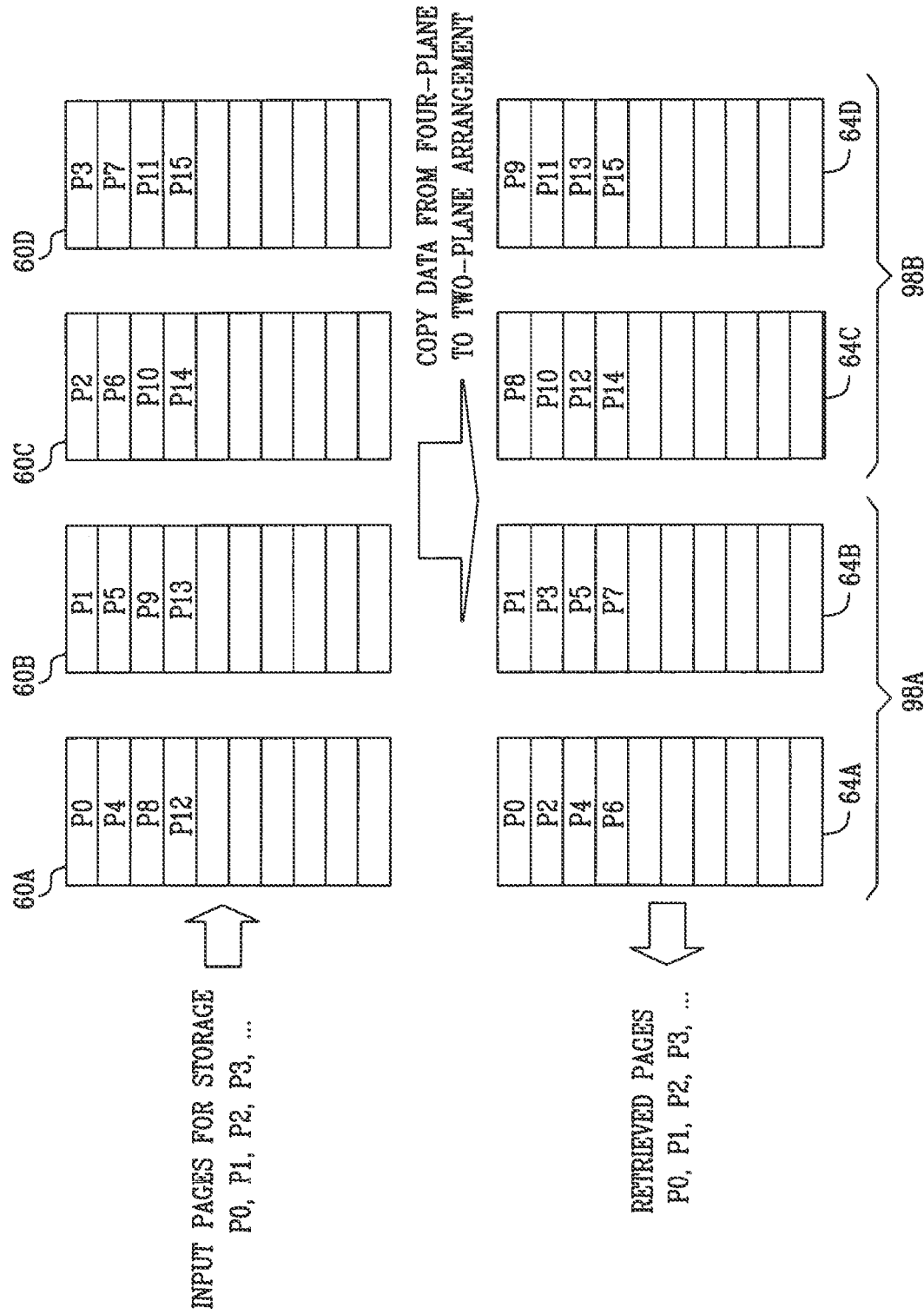
FIG. 4 is a diagram that schematically illustrates a process for rearranging data between two multi-plane formats, in accordance with an embodiment of the present invention.

FIG. 4 is a diagram that schematically illustrates a process for rearranging data between two multi-plane formats, in accordance with an embodiment of the present invention. In the example of FIG. 4, the MSP initially stores a sequence of data pages in four memory planes 60A ... 60D, similarly to the initial storage process of FIG. 2 above.

At a later time (e.g., during an idle period of the system), the MSP rearranges the data pages into a two-plane format. Memory planes 64A ... 64D are divided into two groups 98A and 98B, each comprising two memory planes. The MSP rearranges the sequence of pages such that successive pages in the sequence are stored in alternation in two memory planes. As can be seen in the figure, pages P0 ... P7 are stored in memory planes 64A and 64B. Pages P8 ... P15 are stored in memory planes 64C and 64D.

When retrieving the data sequentially, the sequence of pages can be read using multi-plane (e.g., two-plane or four-plane) read commands. In the present example, a first two-plane read command retrieves pages P0 and P1, a second command retrieves pages P2 and P3, and so on. When the data pages stored in group 98A are retrieved, another sequence of two-plane read commands can read pages P8 and P9, P10 and P11, P12 and P13, and finally P14 and P15.

Note that the data rearrangement process can be carried out using four-plane read and write commands, even though the resulting arrangement is a two-plane arrangement. Each multi-plane command stores two data pages in each of groups 98A and 98B. In these embodiments, the R/W unit reads and caches the initially-stored pages P0 . . . P15 from planes 60A . . . 60D using four-plane read commands. Then, the R/W unit stores the cached pages in planes 64A . . . 64D at the appropriate order (e.g., store pages P0,P1,P8,P9 in a given command, store pages P2,P3,P10,P11 in another command, etc.)

In some embodiments, the MSP performs multi-plane to single-plane rearrangement (or multi-plane to multi-plane rearrangement) by applying a series of progressive rearrangement operations, such that each rearrangement operation reduces the number of planes over which successive pages are stored. For example, the MSP may rearrange the data from four-plane to two-plane format, as shown in FIG. 4. Then, the MSP can rearrange each of groups 98A and 98B from two-plane into single-level format, as shown in FIGS. 2 and 3 above. Any desired number of intermediate rearrangement steps can be used.

This progressive rearrangement process provides a soft trade-off between rearrangement speed and reading performance. When using this process, the memory device can provide data formats, whose reading performance increases over time. If the host requests the data when the rearrangement process is still in progress, the best available data format (the completed format having the smallest number of planes) can be used for reading.

In some embodiments, the initial storage operation (e.g., step 74 in FIG. 3 above) may use a programming configuration that is different from the programming configuration used for data rearrangement (e.g., at step 78 of FIG. 3). Typically, the initial storage operation is temporary by nature, and is shortly followed by data rearrangement. As such, the initial storage operation can be optimized for speed, possibly at the expense of endurance and storage density. The programming configuration used for storing the rearranged data, on the other hand, is typically optimized for endurance and density.

Various programming parameters may differ between the initial storage operation and the rearrangement operation. For example, the programming speed of the initially-stored data can be increased by using a relatively small number of programming levels (e.g., using only two levels), so that each cell stores a small number of bits. The rearranged data, on the other hand, may be subsequently stored using a higher number of programming levels so as to achieve higher density.

As another example, when the cells are programmed using an iterative Program and Verify (P&V) process, the initial storage operation may use a relatively large P&V step size (i.e., a relatively large increment between successive programming pulses), so as to increase programming speed. The rearrangement operation, on the other hand, is typically performed using a smaller P&V step size, so as to improve programming accuracy and thus the reliability and endurance of the stored data. Additionally or alternatively, the MSP (using R/W unit 36) may vary any other suitable programming parameter between the initial storage operation and the storage operations used in data rearrangement.

Cross-Coupling Cancellation with Page Read-Ahead

As noted above, MSP 40 cancels cross-coupling interference in a give interfered page based on the data of neighboring pages. In some embodiments, the MSP reads pages that were not yet requested by the host, and uses these pages for canceling interference in requested pages. This function is referred to herein as read-ahead. In many cases, especially when reading large amounts of data stored sequentially in successive pages, the read-ahead pages are likely to be requested by the host while they are still cached by the MSP, so that the read operations of these pages are not redundant.

Figure 5:
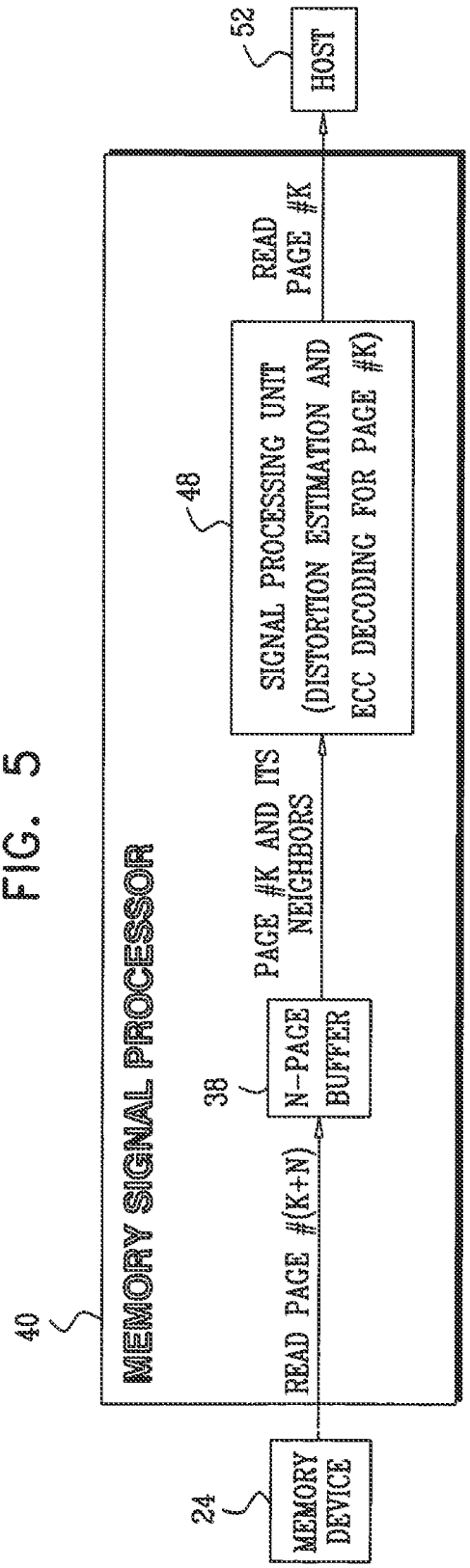
FIG. 5 is a block diagram that schematically illustrates a process for retrieving data from a memory device, in accordance with an embodiment of the present invention.

FIG. 5 is a block diagram that schematically illustrates a process for retrieving data from memory device 24 by MSP 40, in accordance with an embodiment of the present invention. In this embodiment, page buffer 38 is capable of caching N memory pages. The host instructs the MSP to read data pages sequentially from the memory device, such as by issuing a series of read requests, each specifying one or more data pages that are to be read.

The MSP reads N pages in advance (i.e., before these pages are actually requested by the host) and stores them in buffer 38. At a certain point in time, the MSP sends a page having an index K to the host, and at the same time reads page K+N from device 24 and caches it in buffer 38. When decoding page K, signal processing unit 48 in the MSP retrieves page K and its neighbors (at least some of which were not yet requested by the host at the given point in time) from buffer 38. This sort of pipelined operation enables unit 48 to perform functions such as cross-coupling estimation and cancellation, and possibly ECC decoding, based on page K and its neighbors, even though some or all of the neighbors were not yet requested by the host.

In some embodiments, when rearranging the data pages (e.g., at step 78 of the method of FIG. 3), the MSP programs the data pages in ascending order of the word lines, but in reverse order of the data pages. In other words, if a given block holds M data pages, then the MSP stores the $M^{th}$ data page in the first word line, and continues until storing the first data page in the $M^{th}$ word line. In many scenarios, this programming order reduces the reading delay when performing cross-coupling interference cancellation.

In some embodiments, the data is initially stored in a Dynamic Random Access Memory (DRAM), and then copied into a small number of memory planes of a non-volatile memory, such as Flash memory. Such a configuration may be advantageous, for example, in Solid State Disk (SSD) systems, but can be applied in other applications, as well. Initial storage in DRAM is usually fast, e.g., because DRAMs often store data at a large word width. After initial storage, the data can be copied to non-volatile memory using the methods described herein. In some implementations, the initially-stored data can be copied into multiple planes of the non-volatile memory using multi-plane write commands.

Although the embodiments described herein mainly address data rearrangement in multi-plane memory devices, the principles of the present invention can also be used for other applications, such as applications that store data in multiple dies or devices. For example, some data storage systems receive data streams from multiple sources and store them in an interleaved manner. Using the disclosed methods, such systems may initially store the data streams in an interleaved fashion, and later copy them so that the data of each data stream is arranged consecutively. The rearranged format enables reading each data stream separately at a higher speed.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:

storing a sequence of data pages in a memory;

receiving a series of requests from a host to sequentially retrieve the stored data pages from the memory;

responsively to a given request received at a given time, reading from the memory one or more non-requested data pages in the sequence, which were not yet requested by the host at the given time, as well as reading one or more requested data pages specified in the given request;

caching the read requested and non-requested data pages; and canceling cross-coupling interference in at least one of the requested data pages using the cached requested and non-requested data pages.

2. A data storage apparatus, comprising:

a memory, which comprises multiple memory arrays; and circuitry, which is coupled to initially store a sequence of data pages in the memory such that successive data pages in the sequence are stored in alternation in a first number of the memory arrays, to rearrange the initially-stored data pages in the memory so as to store the successive data pages in the sequence in a second number of the memory arrays, which is less than the first number, and to read the rearranged data pages from the second number of the memory arrays.

3. The apparatus according to claim 2, wherein the circuitry is coupled to read a given data page and one or more neighboring data pages from the second number of the memory arrays, and to cancel cross-coupling interference in the given data page responsively to the read neighboring data pages.

4. The apparatus according to claim 3, and comprising a cache memory, wherein the circuitry is coupled to cache the read data pages in the cache memory such that both the given data page and the neighboring data pages are cached in the cache memory at a given time, and to cancel the interference using the cached given data page and neighboring data pages.

5. The apparatus according to claim 2, wherein the second number of the memory arrays comprises a single memory array.

6. The apparatus according to claim 2, wherein the second number of the memory arrays comprises two or more memory arrays, and wherein the circuitry is coupled to rearrange the initially-stored data pages by storing the successive data pages in alternation in the second number of the memory arrays.

7. The apparatus according to claim 2, wherein the circuitry is coupled to rearrange the initially-stored data pages so as to store the successive data pages in a third number of the memory arrays, which is smaller than the first number and larger than the second number, and to rearrange the data pages stored in the third number of the memory arrays so as to store the successive data pages in the second number of the memory arrays.

8. The apparatus according to claim 2, wherein the circuitry is coupled to define multiple groups of the memory arrays, each group having the second number of the memory arrays, and to rearrange the initially-stored data pages by storing respective subsets of the successive data pages in the groups.

9. The apparatus according to claim 8, wherein the circuitry is coupled to store the subsets in the groups using multi-plane write commands, each command specifying storage of the second number of the data pages in each of the groups.

10. The apparatus according to claim 2, wherein the circuitry is coupled to initially store the sequence using multi-plane write commands, each command specifying storage of the first number of the data pages in the first number of the memory arrays.

11. The apparatus according to claim 2, wherein the circuitry is coupled to send an acknowledgement indication responsively to a successful completion of initially-storing the sequence, irrespective of rearrangement of the initially-stored data pages.

12. The apparatus according to claim 2, wherein the circuitry is coupled to rearrange the data pages during an idle period in which no memory access operations are performed.

13. The apparatus according to claim 2, wherein each of the memory arrays comprises a plurality of analog memory cells, and wherein the circuitry is coupled to initially store the sequence by programming the memory cells in the first number of the memory arrays using first programming parameters, and to rearrange the data pages by programming the memory cells in the second number of the memory arrays using second programming parameters, different from the first programming parameters.

14. The apparatus according to claim 13, wherein the circuitry is coupled to program the memory cells using the first programming parameters by programming the memory cells to assume a first number of programming levels, and to program the memory cells using the second programming parameters by programming the memory cells to assume a second number of programming levels, larger than the first number.

15. The apparatus according to claim 13, wherein the circuitry is coupled to program the memory cells using the first programming parameters by applying to the memory cells a first sequence of programming pulses whose amplitude increases incrementally by a first step size, and to program the memory cells using the second programming parameters by applying to the memory cells a second sequence of programming pulses whose amplitude increases incrementally by a second step size, smaller than the first step size.

16. The apparatus according to claim 2, wherein the circuitry is coupled to receive a request from a host to retrieve one or more requested data pages in the sequence, to read from the second number of the memory arrays, responsively to the request, one or more non-requested data pages in the sequence that were not requested by the host in addition to reading the requested data pages, to cache the read requested and non-requested data pages, and to cancel cross-coupling interference in at least one of the requested data pages using the cached requested and non-requested data pages.

17. The apparatus according to claim 2, wherein the memory comprises a Dynamic Random Access Memory (DRAM) and a non-volatile memory, and wherein the circuitry is coupled to initially store the data pages in the DRAM and to rearrange the initially-stored data pages by copying the data pages from the DRAM to the non-volatile memory.

18. The apparatus according to claim 2, wherein the memory cells in the second number of the memory arrays are arranged along multiple word lines, and wherein the circuitry is coupled to rearrange the initially-stored data pages by storing the data pages in an ascending order of the word lines and in a reverse order of the sequence.

19. A data storage apparatus, comprising:

a memory; and a processor, which is coupled to store a sequence of data pages in a memory, to receive a series of requests from a host to sequentially retrieve the stored data pages from the memory, to read from the memory, responsively to a given request received at a given time, one or more non-requested data pages in the sequence that were not yet requested by the host at the given time, as well as reading one or more requested data pages specified in the given request, to cache the read requested and non-requested data pages, and to cancel cross-coupling interference in at least one of the requested data pages using the cached requested and non-requested data pages.

20. A data storage apparatus, comprising:

an interface, which is operative to communicate with a memory that includes multiple memory arrays; and a processor, which is coupled to initially store a sequence of data pages in the memory such that successive data pages in the sequence are stored in alternation in a first number of the memory arrays, to cause the memory to rearrange the initially-stored data pages in the memory so as to store the successive data pages in the sequence in a second number of the memory arrays, which is less than the first number, and to read the rearranged data pages from the second number of the memory arrays.

* * * * *